United States Patent
Yang et al.

(10) Patent No.: US 6,274,481 B1
(45) Date of Patent: Aug. 14, 2001

(54) PROCESS SEQUENCE TO IMPROVE DRAM DATA RETENTION

(75) Inventors: Ming Yang, Richardson; Jim Huang, Plano, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/196,911

(22) Filed: Nov. 20, 1998

Related U.S. Application Data

(60) Provisional application No. 60/066,613, filed on Nov. 26, 1997.

(51) Int. Cl.[7] ............................................ H01L 21/4763
(52) U.S. Cl. ........................ 438/634; 438/637; 438/705
(58) Field of Search .................................. 438/634, 637, 438/639, 705, 735, 266, 267

(56) References Cited

U.S. PATENT DOCUMENTS

| | | | |
|---|---|---|---|
| 5,023,676 | * 6/1991 | Tatsuta | 357/22 |
| 5,252,506 | * 10/1993 | Carter et al. | 437/47 |
| 5,290,718 | * 3/1994 | Fearon et al. | 437/34 |
| 5,872,063 | * 2/1999 | Chao et al. | 438/762 |
| 5,907,772 | * 5/1999 | Iwasaki | 438/253 |
| 5,933,755 | * 8/1999 | Lee | 438/634 |
| 6,066,555 | * 5/2000 | Nulty et al. | 438/634 |
| 6,087,238 | * 7/2000 | Gardner et al. | 438/304 |

FOREIGN PATENT DOCUMENTS

| | | | |
|---|---|---|---|
| 0418468-A1 | * 3/1991 | (EP) | H01L/21/314 |
| 01145821 | * 6/1989 | (JP) | H01L/21/31 |

* cited by examiner

*Primary Examiner*—Matthew Smith
*Assistant Examiner*—Renzo N. Rocchegiani
(74) *Attorney, Agent, or Firm*—Jacqueline J. Garner; W. James Brady, III; Frederick J. Telecky, Jr.

(57) ABSTRACT

The sidewall nitride etch is modified to leave a thin layer of nitride covering the silicon in a DRAM array. The nitride layer prevents damage to the silicon and improves the integrity and refresh time of the array.

8 Claims, 6 Drawing Sheets

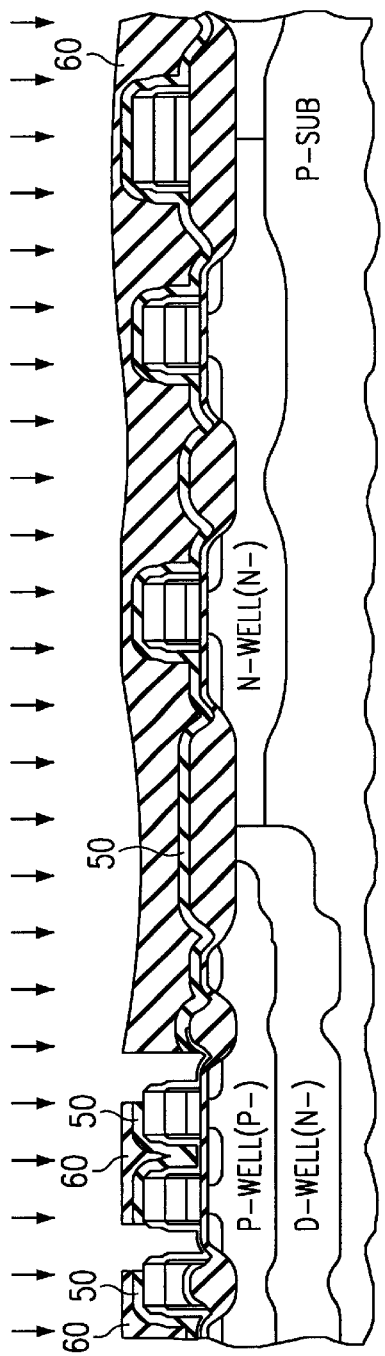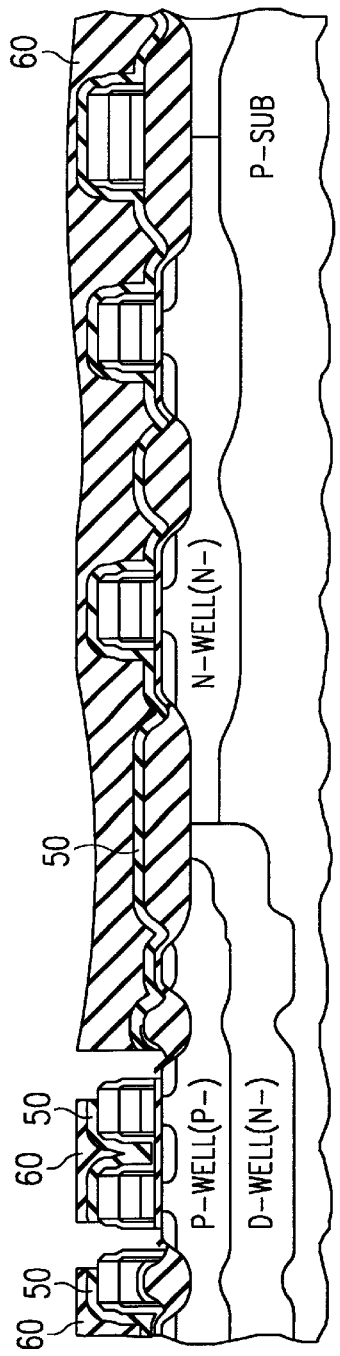
FIG. 2G
FIG. 2H

PROCESS SEQUENCE TO IMPROVE DRAM DATA RETENTION

This application claims priority under 35 USC § 119 (e)(1) of provisional application number 60/066,613, filed Nov. 26, 1997.

BACKGROUND AND SUMMARY OF THE INVENTION

The present invention relates to integrated circuit structures and fabrication methods, and more particularly to improving data retention in DRAM devices.

BACKGROUND

Dram Processes

In current DRAM process, three factors have been identified as degrading the cell data retention. Since the length of time between refreshes of the memory, also known as the "pause", is a very important parameter in DRAM, resolving these factors is a high priority.

First, the surface of the silicon can be damaged by plasma induced chemical damage during the contact etch process. This plasma induced damage includes damage caused by bombardment of the surface with highly energetic fluorine ions, as well as the presence of oxygen ions, which are formed during the etch of the BPSG.

Secondly, the silicon can be contaminated by impurities in the BPSG layer being etched or by carbon from the etch itself. These impurities can diffuse into the silicon, and they can be lifetime killers for the circuits.

A third factor which affects the data retention is the electric field surrounding the contact regions. A contact diffusion which has greater straggle, i.e., is more scattered, has a lower electric field. This lower electric field is desirable, since it has effect on the data retention.

Innovative Structures and Methods

The present application discloses that the sidewall nitride etch is stopped short, so that a thin layer (e.g. 10–30 nm) of nitride is left on the silicon surface of the active areas. The nitride will be patterned and etched so that the thinned layer of nitride remains in the DRAM array, but only nitride sidewall spacers are left in the peripheral logic areas. The remaining thin layer of nitride protects the silicon under the contact area in the DRAM during the subsequent etch, while its presence in the logic transistors would adversely affect performance.

When contacts are etched for the DRAM cells, a two-step process is used. First, a highly selective etch is performed to ensure there is no damage to the first gate nitride. After reaching the thin nitride layer, the etch process is stopped while dopants for the contact are implanted through tie nitride layer. Then the etch process is resumed with an appropriate chemistry to etch through the nitride layer.

The presence of the nitride layer during the contact etch and DRAM implantation has a very positive affect, reducing both damage and contamination to the silicon. Additionally, implanting the contact through the nitride layer causes the dopant to be more scattered, which improves the electric field. This process has been tested in a 0.2 micron layout, as discussed below.

Advantages of the disclosed methods and structures include:

silicon damage during etch is reduced or eliminated;
silicon contamination during etch is reduced or eliminated;
electric field at contact is improved;
data retention problems are reduced or eliminated;
reliability of DRAM array is increased;
no increase in cell height;
can be done with as little as one additional step in flow.

BRIEF DESCRIPTION OF THE DRAWINGS

The disclosed inventions will be described with reference to the accompanying drawings, which show important sample embodiments of the invention and which are incorporated in the specification hereof by reference, wherein:

FIGS. 2A–2H show a cross-section of a partially fabricated wafer at various points during the fabrication process.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

First Process Embodiment

Figure 1A:
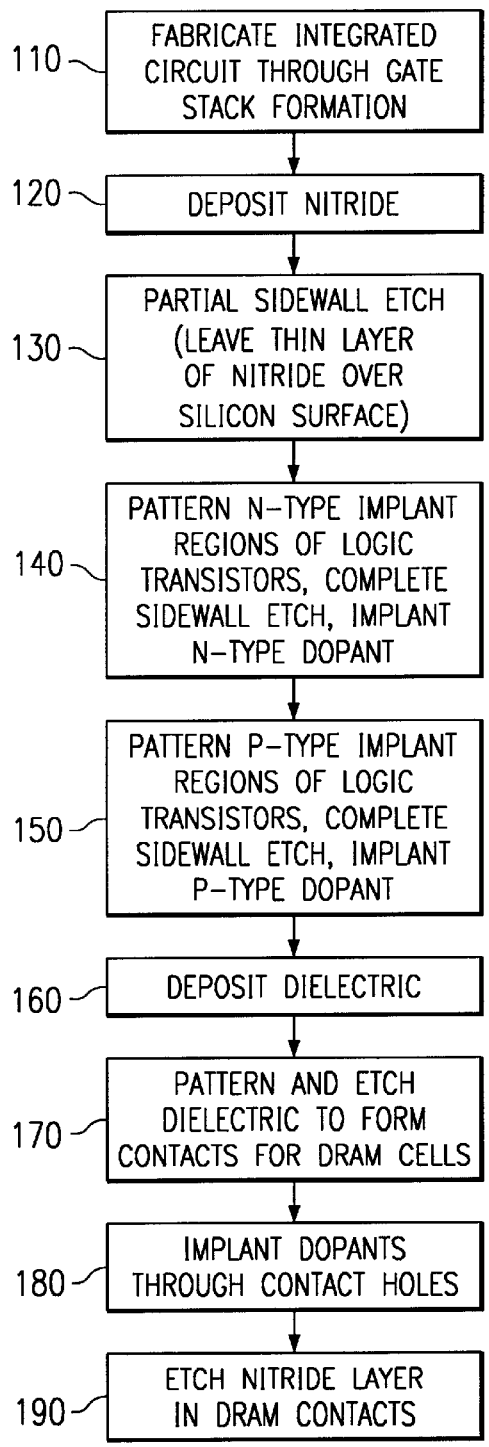
FIGS. 1A and 1B show flowcharts of two embodiments of the disclosed fabrication method.
Figure 1B:
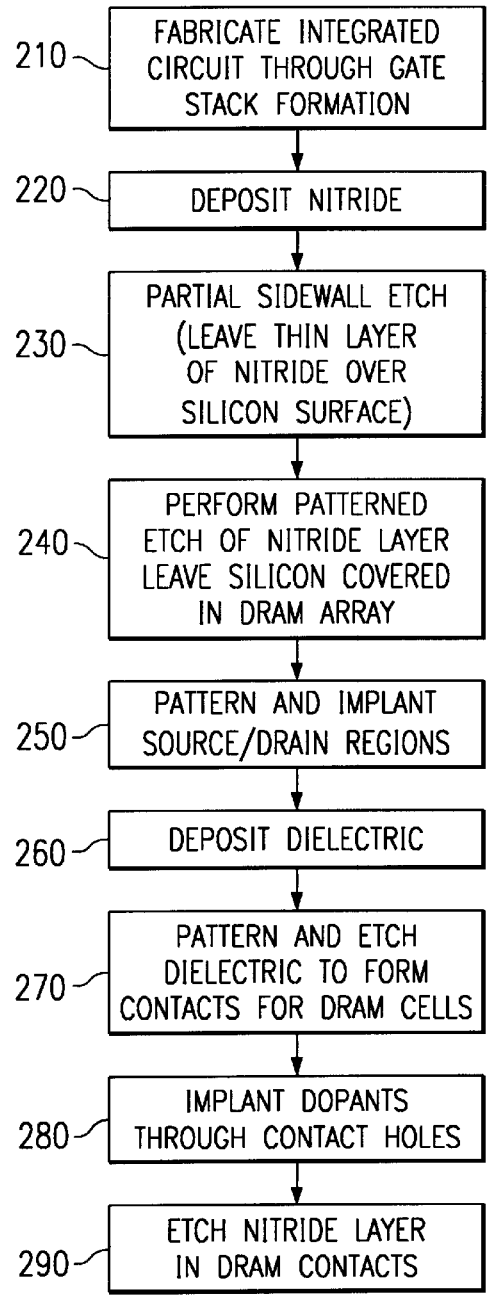
Figure 2A:
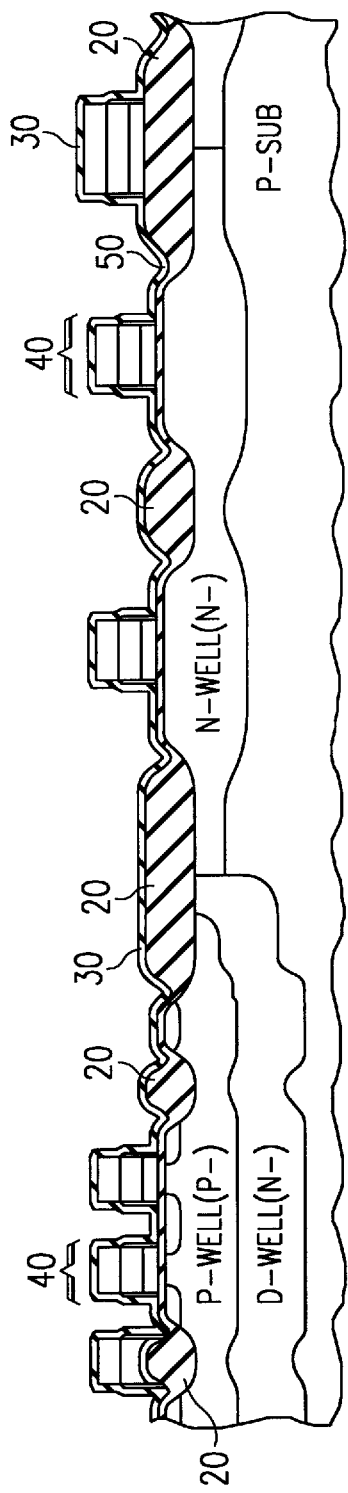
Figure 2B:
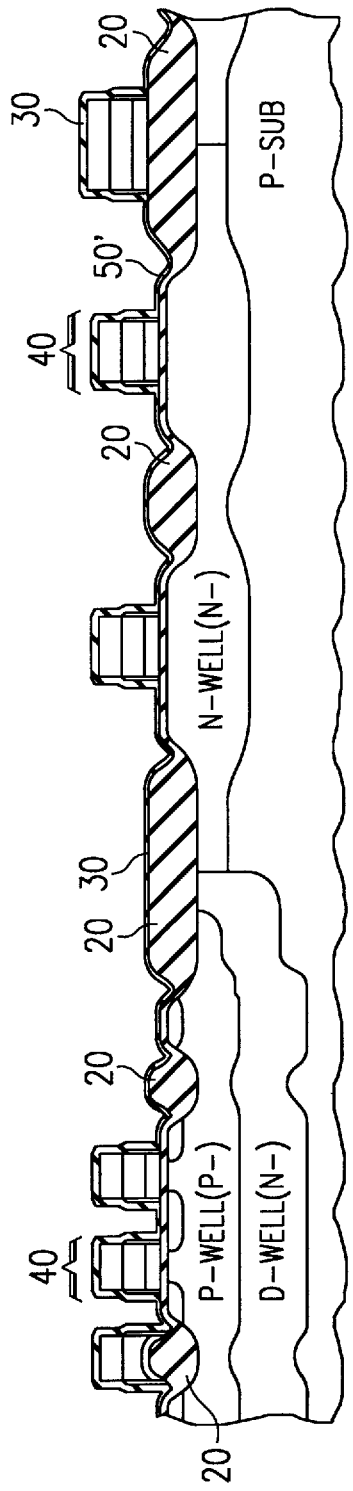
Figure 2C:
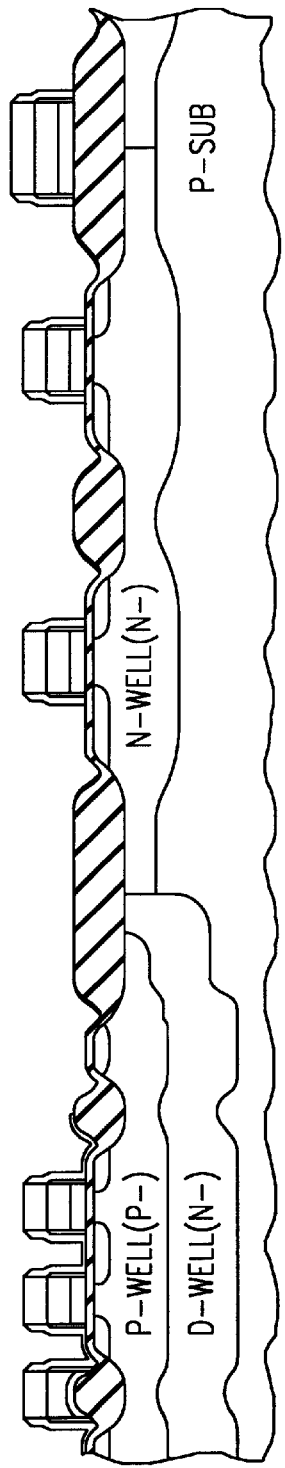
Figure 2D:
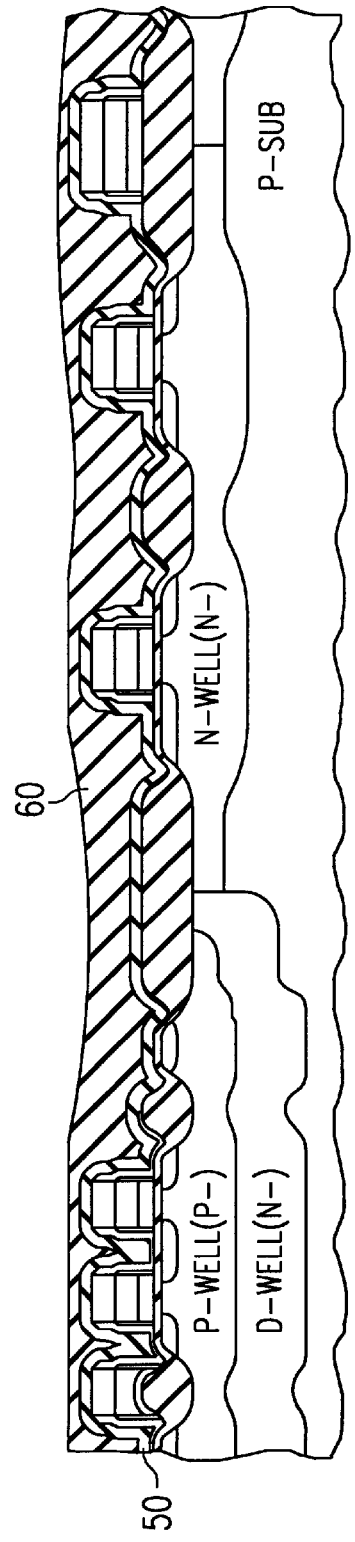

A flowchart for one embodiment of the disclosed method is seen in FIG. 1B, which will be explained in conjunction with FIGS. 2A–2H, which show a portion of the wafer at various times during the process. First, isolations structures 20 are formed, as well as a gate dielectric 30 and silicon gate lines 40 (step 210). A layer of nitride 50, e.g., a 105 nm layer of silicon nitride, is deposited over the wafer (step 220), as shown in FIG. 2A. In prior processes, all of the nitride would be removed, except for the sidewall spacers. Instead, in the disclosed method, the etch is shortened to leave approximately 10–30 nm of nitride on the surface of the wafer (step 230), as shown in FIG. 2B, where the layer of nitride 50' has been thinned, but not removed. A typical recipe for this etch step is as follows:

Source Flow: 15 sccm of CHF3;
Source Flow: 5 sccm of O2;
Inert Flow: 75 sccm of Ar;
RF power: 400 Watts per square cm;
Total Pressure: 100 mTorr.

At this point, a layer of photoresist is deposited and patterned to remain only over the DRAM array. Following this, the above etch is resumed with a reduced power of 250 Watts, and is carried to the detected endpoint, so that the pattern is transferred to the thin layer of nitride (step 240). This is followed by removal of the patterned photoresist layer, leaving the wafer shown in FIG. 2C, where the 30 nm nitride layer is present only in the DRAM array.

Patterning and implantation of the source/drain regions (step 250) then proceeds as in the known process, followed by deposition (step 260) of the dielectric 60, seen in FIG.

Figure 2E:
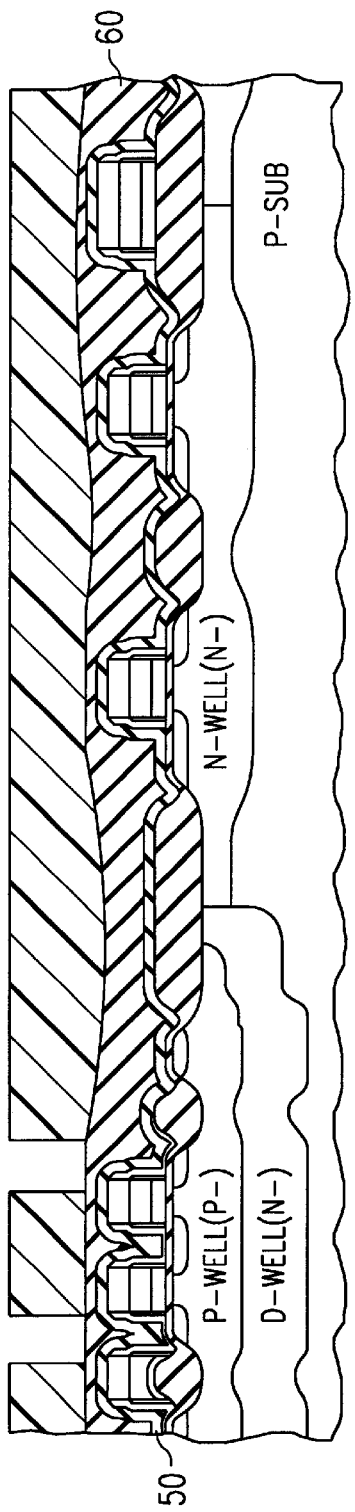
Figure 2F:
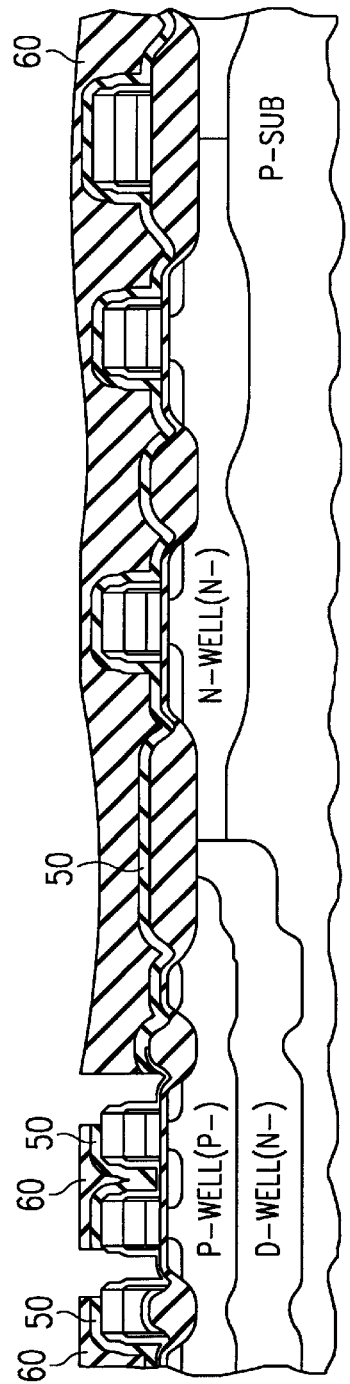

2D. Patterning and etching of the dielectric layer to form the DRAM contacts (step 270) are shown in FIGS. 2E–2F. A typical recipe for the dielectric etch is as follows:

Source Flow: 14 sccm of C4F8;
Source Flow: 240 sccm of CO;
Inert Flow: 320 sccm of Ar;
RF power: 1700 Watts per square cm;
Total Pressure: 35 mTorr;
Time 83 seconds.

At the completion of the dielectric contact etch, only the thinned layer of nitride 50' and the gate dielectric 30 cover the silicon. The implantation of the DRAM array (step 280) takes place through the nitride layer, as shown in FIG. 2G, providing further protection for the array silicon. The presence of the nitride layer provides increased scattering of the dopant and improves the electrical field around the contact. A final etch step is then used to remove the nitride from the bottom of the contact holes (step 290), giving the structure shown in FIG. 2H. Note that a portion of the nitride can be found under the dielectric over active areas which are not affected by the contact etch, as pointed to by the arrow in FIG. 2H. A typical recipe for the nitride etch is as follows:

Source Flow: 50 sccm of CHF3;
Source Flow: 175 sccm of CO;
RF power: 1700 Watts per square cm;
Total Pressure: 25 mTorr;
Time: 7 sec.

Alternate Embodiment

In an alternate embodiment, a flowchart of which is shown in FIG. 1A, it is possible to eliminate the separate step to pattern the nitride layer. In this embodiment, after the layer of nitride is deposited and thinned (step 130), the process moves directly to the implantation of the peripheral transistors. After the areas to receive the N-type dopants are patterned, the nitride etch is completed, to leave only sidewall spacers, and N-type dopants are implanted (step 140). The same steps of patterning, completing the sidewall etch. and implantation is then performed for the P-type dopants (step 150), although of course, these two steps could be in the reverse order. The process then continues with dielectric deposition (step 160), contact etch through the dielectric (step 170), implantation through the contact holes (step 180), and etching the nitride layer exposed in the contact holes (step 190). This embodiment eliminates several steps from the prior embodiment, and is the presently preferred embodiment.

Test Results

Test were run with three factors varied: whether of not the partial nitride etch was performed, whether ion implantation was performed right after plug oxide etch or not, and which nitride over etch was performed (DRM or LAM). The splits are as follows:

Split Description

STD baseline (sidewall nitride main etch and over-etch, plug oxide etch, implant, BLCT)

1 sidewall nitride main etch, plug oxide etch, nitride over-etch (DRM), implant (1e13), BLCT, nitride over-etch (DRM)

2 sidewall nitride main etch, plug oxide etch, nitride over-etch (LAM), implant (1e13), BLCT, nitride over-etch (LAM)

3 sidewall nitride main etch, plug oxide etch, implant (1e13), nitride over-etch (DRM), BLCT, nitride over-etch (DRM)

4 sidewall nitride main etch, plug oxide etch, implant (1e13), nitride over-etch (LAM), BLCT, nitride over-etch (LAM)

The etch time and chemistry for the above operations are as follows:

1) Sidewall nitride over etch:48 s/300 mT/150 He/12O2/45CHF3
2) Plug oxide etch: 75 s/1799 W/35 mT/14C4F8/240CO/340Ar
3) DRM nitride over etch: 5 s/1700 W/25 mT/50CHF3/175CO
4) LAM nitride over etch:80 s/300 mT/150 He/12O2/45CHF3

The test results from different splits are shown in the table below, giving the number of initial failing bits (@100 ms) with the splits:

| tREF (ms) | STD | Split 1 | Split 2 | Split 3 | Split 3 |
|---|---|---|---|---|---|
| 100 | 0 | 0 | 0 | 0 | 0 |
| 150 | 2 | 0 | 0 | 4 | 17 |
| 200 | 9 | 1 | 3 | 22 | 7 |
| 250 | 30 | 13 | 11 | 3 | 7 |
| 300 | 58 | 28 | 30 | 10 | 13 |
| 350 | 105 | 56 | 50 | 20 | 39 |
| 400 | 172 | 103 | 89 | 43 | 69 |
| 500 | 384 | 254 | 242 | 133 | 201 |
| 600 | 685 | 522 | 450 | 268 | 417 |
| 800 | 1623 | 1272 | 1032 | 772 | 116 |
| 1000 | 2989 | 2259 | 965 | 1547 | 2093 |
| 2000 | 41773 | 26008 | 23178 | 21420 | 25161 |
| 4000 | 1164451 | 1104068 | 1058440 | 965935 | 1054174 |
| 6000 | 5156849 | 5763183 | 5626116 | 5097801 | 5483926 |
| 8000 | 11146773 | 13179539 | 12909358 | 11804991 | 12585502 |
| 10000 | 17649150 | 21088383 | 20658072 | 19151906 | 20139514 |

The pause value can be derived from the above test data:

| Pause (ms) | 10 bitfall | 20 bitfall |
|---|---|---|
| Baseline | 200 | 220 |
| Split-1 | 240 | 275 |
| Split-2 | 250 | 275 |
| Split-3 | 300 | 350 |
| Split-4 | 290 | 320 |

Conclusions

1. A silicon nitride layer of approximately 30 nm can effectively protect the silicon substrate from plasma damage, pause is improved in all splits compare with baseline.
2. The combination of reduced plasma damage and modified electrical field strength improves the pause dramatically. Implant through thin nitride can reduce the electrical field strength especially when the plugs are mis-aligned.
3. With standard SNCT ion implantation, the pause on both DRM and LAM etchers are almost the same results, but on nitride screened SNCT ion implantation splits, the DRM tool has a larger improvement than LAM.
4. The data clearly prove that the new proposed process sequence can improve the pause performance and with further optimization, it is believed that the pause time can be improved even more.

Figure 3A:
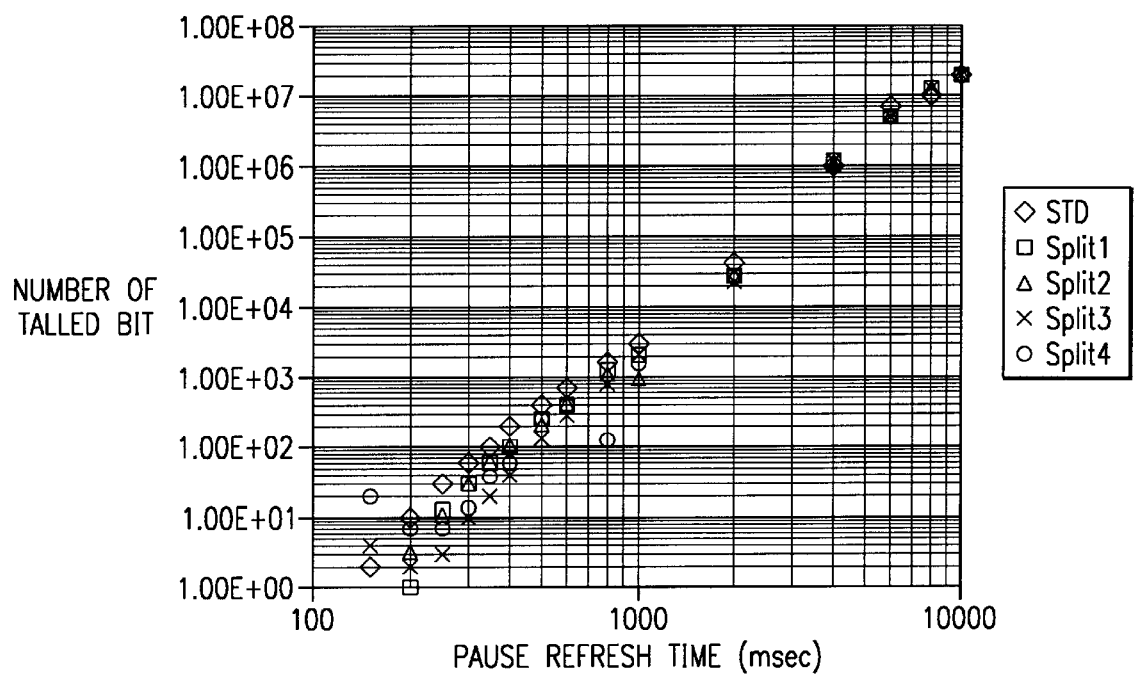
FIG. 3A shows a distribution of failed bits vs. refresh time.
Figure 3B:
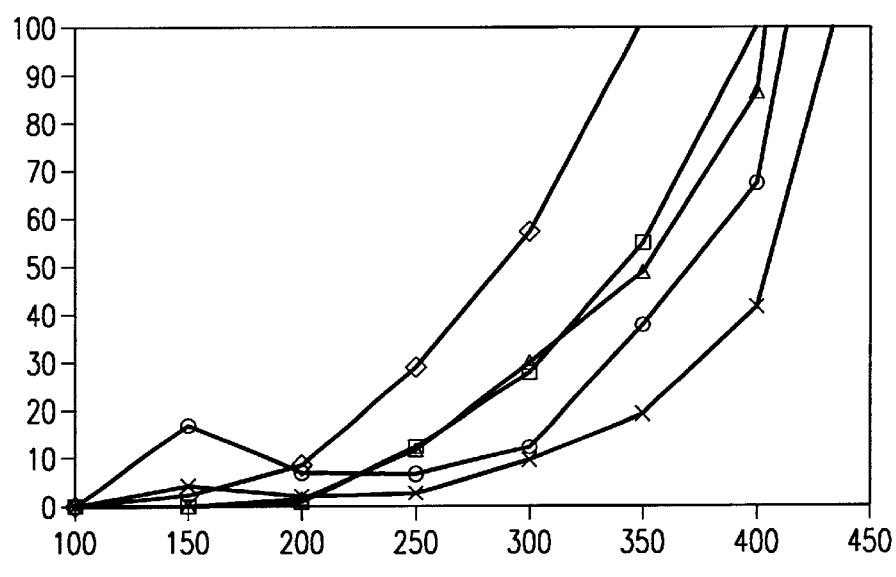
FIG. 3B is a graph of failed bits vs. pause refresh time.

FIG. 3A shows a distribution of failed bits versus refresh time, while FIG. 3B is a graph of the failed bits versus pause refresh time. It should be noted that calculations have shown that the ideal pause, assuming no silicon damage, is 400 milliseconds. The disclosed process approaches a pause of 350 milliseconds with an acceptable failure rate, a substantial improvement over the less than 250 millisecond pause of the standard process.

According to a disclosed class of innovative embodiments, there is provided: A fabrication method, comprising the steps of: (a.) depositing a layer of nitride over a gate structure and active areas of a transistor; (b.) thinning said layer of nitride only partially; (c.) depositing a layer of dielectric over said layer of nitride; (d.) etching contact holes through said dielectric with a selective etch which stops on said nitride; (e.) etching through said nitride layer where exposed in said contact holes.

According to another disclosed class of innovative embodiments, there is provided: A fabrication method, comprising the steps of: (a.) forming gate stacks for a memory cell array on a wafer which also contains gate stacks for logic transistors; (b.) depositing and only partially etching a layer of nitride over said gate stacks and said wafer to form a thinned layer of nitride; (c.) patterning and etching said thinned layer of nitride to leave said thinned layer of nitride substantially in place over said memory cell array but to remove, except for sidewall spacers, said thinned layer of nitride over said logic transistors; (d.) forming active areas of said logic transistors in which said thinned layer of nitride has been removed; (e.) after said steps (c.) and (d.), depositing a dielectric over said wafer and said gate stacks; f.) etching through said dielectric to form contact holes for said memory cell array, wherein said thinned layer of nitride form an etch stop; (g.) etching through said thinned layer of nitride exposed in said contact holes.

According to another disclosed class of innovative embodiments, there is provided: An integrated circuit structure comprising: a gate structure overlying a semiconductor material containing active areas; a continuous layer of nitride overlying sidewalls of said gate structure and portions of said semiconductor material adjacent said gate; a contact structure adjacent at least a portion of said continuous layer of nitride.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

For example, the use of a thin protective layer of nitride can be used in formation of logic, especially with dense contacts (e.g. in SRAM) to reduce contact leakage.

What is claimed is:

1. A fabrication method, comprising the steps of:
   (a.) depositing a layer of nitride over a gate structure and active areas of a transistor;
   (b.) thinning said layer of nitride only partially;
   (c.) depositing a layer of dielectric over said layer of nitride;
   (d.) etching contact holes through said dielectric with a selective etch which stops on said nitride;
   (e.) etching through said nitride layer where exposed in said contact holes.

2. The fabrication method of claim 1, wherein dopants are implanted into said contact holes after said step (d.), but before said step (e.).

3. The method of claim 1, wherein, after step (b.), said layer of nitride overlying said transistor is approximately 10–30 nm thick.

4. The method of claim 1, wherein step (b.) removes approximately 70–90 percent of the thickness of said nitride as deposited.

5. A fabrication method, comprising the steps of:
   (a.) forming gate stacks for a memory cell array on a wafer which also contains gate stacks for logic transistors;
   (b.) depositing and only partially etching a layer of nitride over said gate stacks and said wafer to form a thinned layer of nitride;
   (c.) patterning and etching said thinned layer of nitride to leave said thinned layer of nitride substantially in place over said memory cell array but to remove, except for sidewall spacers, said thinned layer of nitride over said logic transistors;
   (d.) forming active areas of said logic transistors in which said thinned layer of nitride ahs been removed;
   (e.) after said steps (c.) and (d.), depositing a dielectric over said wafer and said gate stacks;
   (f.) etching through said dielectric to form contact holes for said memory cell array, using said thinned layer of nitride as an etch stop; and
   (g.) etching through said thinned layer of nitride exposed in said contact holes.

6. The fabrication method of claim 5, wherein dopants are implanted into said contact holes after said step (f.), but before said step (g.).

7. The fabrication method of claim 5, wherein said thinned layer of nitride is approximately 10–30 nm thick.

8. The method of claim 5, wherein the partial etching of step (b.) removes approximately 70–90 percent of the thickness of said nitride as deposited.

* * * * *